United States Patent [19]
Alsup et al.

[11] 4,099,148
[45] Jul. 4, 1978

[54] TRANSVERSAL FILTER PRIME SEQUENCE FREQUENCY SYNTHESIZER

[75] Inventors: James M. Alsup; Harper J. Whitehouse, both of San Diego, Calif.

[73] Assignee: The United States of America as represented by the Secretary of the Navy, Washington, D.C.

[21] Appl. No.: 793,218

[22] Filed: May 2, 1977

[51] Int. Cl.² .................. H03H 9/04; H03H 9/26; H03H 9/30; H01L 41/10
[52] U.S. Cl. ..................... 333/70 T; 328/14; 331/107 A; 333/30 R; 333/72
[58] Field of Search .......... 333/70 T, 72, 30 R, 333/71; 328/14, 25; 331/51, 107 A; 364/821, 824, 836, 726; 310/313; 332/31

[56] References Cited
U.S. PATENT DOCUMENTS

| | | | |
|---|---|---|---|
| 3,824,586 | 7/1974 | Quate | 333/70 T |
| 3,891,929 | 6/1975 | Carr et al. | 328/14 |
| 4,024,480 | 5/1977 | Reeder et al. | 333/70 T |

OTHER PUBLICATIONS

Maines et al. "Surface-Acoustic Wave Devices for Signal Processing Applications" in Proceedings of The IEEE, vol. 64, No. 5, May 1976, pp. 639–652.

Primary Examiner—Alfred E. Smith
Assistant Examiner—Marvin Nussbaum
Attorney, Agent, or Firm—Richard S. Sciascia; Ervin F. Johnston; John Stan

[57] ABSTRACT

A frequency synthesizer, for use with a means for generating two sequences of electrical pulses, one sequence having a delay with respect to the other, comprises a surface acoustic wave (SAW) device, adapted to receive one of the sequences of electrical pulses from the generating means. The SAW device comprises a substrate, on the surface of which is disposed a first set of interdigitated electrodes. The electrodes receive the electrical pulses and tranduce them to acoustic waves, which traverse the surface of the substrate. The lengths of the electrodes are configured as a function of $m$, where $m$ is defined by the relation $m = R^n \bmod P$, where P is a prime number, R is a primitive root of P, and $1 \leq n \leq P-1$. A second set of interdigitated electrodes, approximately N-1 in number, is also disposed on the surface of the substrate, the electrodes of the first and second sets being parallel. The second set of electrodes is so disposed as to receive the acoustic waves generated by the first set of electrodes, and transduce them back to electrical signals, which are conducted on a set of leads connected to the electrodes. Means, adapted to receive pulses from the electrical pulse generating means, selectively receives the electrical signals from the second set of electrodes. The receiving means has as an output a signal whose frequency is determined by the order in which the signals are received from the second set of electrodes.

10 Claims, 1 Drawing Figure

TRANSVERSAL FILTER PRIME SEQUENCE FREQUENCY SYNTHESIZER.

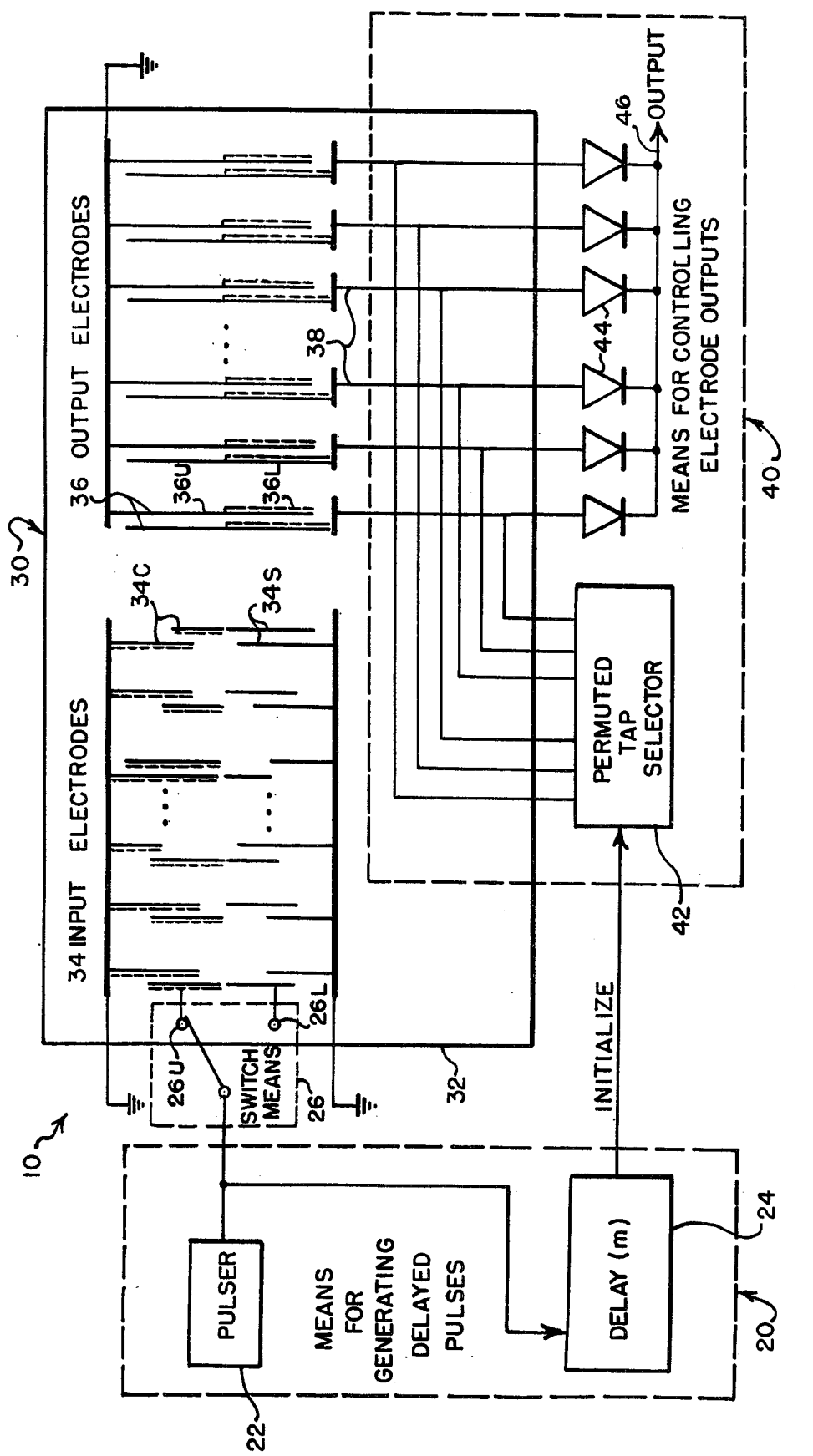
FIG. 1. TRANSVERSAL FILTER PRIME SEQUENCE FREQUENCY SYNTHESIZER.

TRANSVERSAL FILTER PRIME SEQUENCE FREQUENCY SYNTHESIZER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to surface acoustic wave sampled data filters which can be utilized as serial access read-only-memories to directly implement at carrier frequencies a coherent fast-frequency-hop synthesizer in the VHF and UHF ranges. The frequency synthesis scheme uses a surface acoustic wave (SAW) prime-sequence filter. To show, briefly, the evolution of frequency synthesizers, originally, a knob, of an audio oscillator, for example, was turned and the value of an index marker at the knob was read. Later on, programmable frequency synthesizers were developed, which do not require manually turning a knob, wherein servo motors cause rotation of the equivalent of a knob to automatically choose a sequence of frequencies. An electrical signal of the proper code is supplied.

A frequency hopper is an extension of a frequency synthesizer, except the term frequency "hopping" implies that the frequency selection is done rapidly, compared to the speed of frequency selection in the programmable frequency synthesizer. Frequency hopping is often done in the context of spread spectrum.

Many types of frequency synthesizers have been developed over the years, but only recently have read-only-memory (ROM) synthesizers begun to reach maturity. This has occurred primarily because of the advent of sine-cosine lookup tables implemented in digital hardware. Comprehensive background material regarding non-ROM-based frequency synthesizers is furnished by Kroupa, Venceslav F., *Frequency Synthesis*, Halsted Press/John Wiley, New York, 1973. ROM-based synthesis is discussed in references hereinbelow.

However, other types of ROM devices are becoming available, and, in particular, surface acoustic wave (SAW) devices are starting to serve this purpose. ROM synthesis is particularly suited for applications which require coherent fast frequency hopping. SAW ROM technology makes possible the direct extension of ROM synthesis into the VHF and UHF ranges.

There are several prior art methods used to synthesize a sampled sinusoid using discrete ROMs. One method utilizes one period of a sampled sinusoid stored in sequential order in a random access ROM. These methods are described by Tierney, Joseph, Charles M. Rader, and Bernard Gold, "A Digital Frequency Synthesizer," *IEEE Trans. Audio and Electroacoustics*, Vol. AU-19, March 1971, pp. 48-57, and Hosking, Rodger H., "Direct Digital Frequency Synthesis," 1973 *IEEE Intercon Technical Papers*, Section 34/1, New York, 1973.

If all samples of the ROM are read in sequence with a sample time interval $\Delta t$, then a sinusoid of period T and frequency $f_o$ is generated, where $T = N \Delta t = 1/f_o$. However, if every $k$th sample is read with the same sample interval $\Delta t$, then the frequency of the generated sinusoid is $kf_o$. Since $k$ can take on the values $0, 1, \ldots, N-1$, a total of N frequencies which are all harmonically related can be generated. The sampling ambiguity called aliasing may be evident depending upon whether complex or real sinusoids are generated.

A second prior art method for the generation of sampled sinusoids has special application in SAW technology because it utilizes serial-access ROMs. This method consists in multiplying the outputs of two N-sample discrete chirp ROMs whose serial readouts are mutually precessed by $m$ samples to synthesize the frequency $mf_o$. For complex ROMs of the form $exp(j\pi n^2/N)$, the product takes the form $$exp(j\pi n^2/N) \, exp(-j\pi(n-m)^2/N) = exp(j2\pi mn/N) \, exp(-j\pi m^2/N), \quad (1)$$

where $n$ corresponds to the time index and $m$ corresponds to the frequency index. The right hand side of this equation can be interpreted as a sampled complex sinusoid of frequency index $m$ multipled by a complex phase shift which is dependent only on $m$. It will also be noted that $exp(j\pi n^2/N)$ is a periodic function with period $N \Delta t$ (N even) or $2 N \Delta t$ (N odd). This second prior art method has an equivalent continuous-time (non-sampled) implementation utilizing a corresponding continuous SAW ROM.

For frequency hopping applications, either of these two methods requires a hopping interval equal to or greater than $T = N \Delta t$ so that at least one period of each frequency is synthesized with a common nominal bandwidth less than or equal to $1/T$. Thus, the maximum hopping rate for these types of synthesizers is equal to $f_o$. Synthesis may take place at a carrier frequency $f_c$, in which case $f_o$ refers to the "fundamental" frequency which would be observed if the comb-like band of harmonics to be generated at the carrier $f_c$ were shifted to base-band.

Synthesis via read-only-memory is attractive because it makes possible the coherent generation of a harmonic group of discrete frequencies. These frequencies all will start with known initial phases, and use of this a priori information can be made to build coherent receivers capable of recognizing particular phase relationships among sequentially produced tone bursts within the operating band of the synthesizer.

ROM synthesis is also attractive because nearly instantaneous changes can be made when hopping from one frequency to the next. In contrast, a phase-lock-loop synthesizer invariably requires several periods of the waveform being synthesized before a stable lock is acquired.

SUMMARY OF THE INVENTION

A third method for ROM frequency synthesis is the subject of this invention. The synthesizer involves the use of a serial-access memory in conjunction with a permuter so as to achieve the equivalent of a random-access read-only memory (ROM). The invention embodies a configuration for the special case when the ROM is a SAW prime-sequence filter. Such a filter has been disigned and constructed to implement discrete Fourier transforms via the prime transform algorithm. Details on the construction and mode of operation are included in the articles by J. M. Alsup, "Prime Transform SAW Device," *IEEE 1975 Ultrasonics Symposium Proceedings*, Los Angeles, CA, Sept. 1975, Paper G-7, and Rader, C., "Discrete Fourier Transforms When The Number of Data Samples is Prime," Proceedings IEEE, Vol. 56, 1968, pp. 1107-1108.

This filter has as its impluse response the function $$exp(j2\pi m/P), \quad (2)$$

where
$$m = R^n \bmod P, \quad (3)$$

$n = 1, 2, \ldots, P-1$, and R is a primitive root of the prime number P. Thus, this SAW filter can be used as an acoustic ROM to generate permuted values of a sampled complex sinusoid on a carrier.

The advantage of this particular ordering of the ROM samples is apparent in the structure of the auxiliary memory used to operate the tap permuter. This memory is implemented in the form of a cyclically operated sequentially-addressed binary ROM whose starting position relative to the periodic impulsing of the SAW acoustic ROM determines the output frequency. A total of P−1 frequencies can be generated, but for hopping rates slower than $f_o = 1/(P-1) \Delta t$ a complex sample value (1,0) must be inserted into the synthesized output every P−1 sample intervals. This is because the ROM can synthesize all but one point of a P-sample periodic sinusoid sequence, so that to generate more than one period of this sequence, the Pth sample must be synchronously inserted (i.e., P−1).

Such a SAW ROM synthesis scheme is a reasonable alternative to the chirp method if sample permuters become available whose performance exceeds that of the chirp multipliers in terms of output accuracy.

STATEMENT OF THE OBJECTS OF THE INVENTION

An object of the invention is to provide a frequency synthesizer useful for frequency hopping at rates greater than that provided by conventional digital techniques.

Another object of the invention is to provide a frequency synthesizer useful in both the VHF and UHF ranges.

Yet another object of the invention is to provide a frequency synthesizer of relatively simple construction using SAW devices.

These and other objects of the invention will become more readily apparent from the ensuing specification when taken together with the drawings.

BRIEF DESCRIPTION OF THE DRAWINGS

FIG. 1 is a block diagram of the transversal filter prime sequence frequency synthesizer of this invention.

DESCRIPTION OF THE PREFERRED EMBODIMENTS

Referring now to the FIGURE, therein is shown frequency synthesizer 10, for use with a means 20 for generating two sequences of electrical pulses, one sequence having a delay with respect to the other.

A surface acoustic wave device 30, adapted to receive one of the sequences of electrical pulses from the generating means, from pulser 22, comprises a substrate 32, and a first and second set of interdigitated electrodes, 34 and 36, disposed on the substrate. The first set of interdigitated electrodes 34, the input electrodes, disposed on the surface of the substrate 32, receives the electrical pulses from pulser 22 and transduces them to acoustic waves which traverse the surface of the substrate. The lengths of the electrodes are configured as a function of m, where m is defined by the relation $m = R^n \bmod P$, where R is a primitive root of P, P is a prime number, and $n = 1, 2, \ldots, P-1$.

The second set of interdigitated electrodes 36, the output electrodes, approximately P−1 in number, are also disposed on the surface of the substrate 32. The electrodes of the first and second sets, 34 and 36, are parallel, the second set of electrodes 36 being so disposed as to receive the acoustic waves generated by the first set of electrodes 34, and transduce them back to electrical signals, which are conducted on a set of leads 38 connected to the electrodes.

A key feature of the invention relates to the input electrodes 34 and output electrodes 36 being so disposed with respect to each other that the signal received from the top parts of the output electrodes has a phase shift of 90°, at a frequency $f_0$, with respect to the phase shift of the signal received from the bottom parts of the output electrodes.

Means 40 are adpated to receive pulses from the electrical pulse generating means 20. The means 40 selectively receives the electrical signals from the second set of electrodes 36, the receiving means having as an output a signal whose frequency is determined by the particular cyclic shift of the order in which the signals are received from the second set, the output set, of electrodes 36.

In the frequency synthesizer 10, the first set of electrodes 34, which are input electrodes, may comprise two sets of electrodes, an upper set 34C and a lower set 34S, each set consisting of pairs of electrodes. A pair 34C of one set is parallel to a corresponding pair 34S of the other set, the sum of the lengths squared of each two corresponding pairs of electrodes 34 being a constant.

In the frequency synthesizer 10 the upper set of input electrodes 34C may be so configured as to be offset by one-quarter wavelength from the lower set 34C of input electrodes. This is shown by the dashed lines at the upper input electrodes 34C.

In another embodiment, in the frequency synthesizer 10 the output electrodes 36 may be configured so that the upper half 36U of each output electrode is offset by one-quarter wavelength from its corresponding lower half 36L, again, as shown by the dashed lines.

In yet another embodiment of the invention, in the frequency synthesizer 10, as may be seen in the FIGURE, the upper set of input electrodes 34C may be configured so as to be offset from the bottom set 34S of input electrodes, as shown by the dashed lines. Also, the output electrodes 36 may be configured so that the upper half 36U of each output electrode is offset from its corresponding bottom half 36L. The total amount of offset for the input and output electrodes, 34 and 36, would be one-quarter wavelength.

The frequency synthesizer 10 may further comprise the means 20 itself for generating the two sequences of electrical pulses. The means for generating the two sequences of electrical pulses 20 may comprise means 22, whose output is connected to the input electrodes 32, for producing a sequence of pulses at its output, and means 24 whose input is connected to the output of the pulse producing means 22, for delaying the pulses at its input, the output of the delaying means being connected to the input of the selective receiving means 40.

The reason for the delay between the two sequences of pulses is that the amount of delay is proportional to the frequency that it is desired to synthesize. If there were no delay, then operation would be at d-c (baseband) or the center frequency, the basic frequency of the system, when operating on a "carrier" like a SAW device does.

If the delay be changed to some nonzero value, the synthesizer 10 will synthesize some other frequency. This will occur even though the pulses pass over a fixed set of interdigitated electrodes, input electrodes 34 and output electrodes 36.

In a broad embodiment of the invention, the specific construction showing a pulser 22 and a delay line 24 is not the only possible configuration. In fact, two pulsers, synchronized to each other, without the delay line 24, would also work, if one generated a pulse delayed with respect to the pulse generated by the other. All that is required is a means for generating two pulses, where one may have specific delays with respect to the other. In frequency synthesizer 10 the receiving means 40 may comprise means, adapted to receive the signals from the second set of electrodes 36, which means has the same number of inputs as there are pairs of electrodes in the second set of electrodes, the inputs 38 being connected to the electrode outputs.

The frequency synthesizer 10 may further comprise means 26, the input of which is connected to the output of the first pulse-generating means 22, for transmitting, or switching, the pulse to either of two alternate connections, 26U and 26L. In this embodiment, the first pulse-generating means 22 generates pulses alternately to the upper and lower sets of input electrodes 34C and 34S, with a time day, $\Delta t$, = $(1/4f_0)$, equivalent to an acoustic delay corresponding to a distance equal to one-quarter wavelength.

Means 42 are adpated to receive input pulses from the pulse-delaying means 24. The means 42 has connections to each of the pairs of output electrodes 36, thereby controlling the sequence in which signals are conducted to the output of the selective receiving means 40. As shown, the means is a permuted tap selector or switch 42.

Referring back to FIG. 1, the means 40 adapted to receive input pulses may further comprise a set of unilateral conducting devices 44, one in the output path 38 of each of the pairs of output electrodes 36, which can be enabled to pass signals through the respective output paths, to the output 46. The set of unilateral conducting devices 44 may be diodes.

Discussing now the theory behind the invention, a prime sequence is a sequence which is most easily defined by using number theory. Probably the best reference for background information, even though the oldest, is Gauss, C. F., *Disquisitiones Arithmeticae*, translated by Arthur A. Clarke, Yale University Press, New Haven and London, 1966. Lipsiae, 1801.

Gauss defines these prime sequences as being based on an algorithm. As an example using specific numbers, assume the prime number P of interest is 17. As sequence can be constructed having a length of 16 (=17−1), which includes all of the numbers 1 through 16, but specifically excludes 0. Associated with each prime number P is one or more primitive roots R, and with each primitive root are associated powers of primitive roots, $R^n$, $n = 1, 2, \ldots ,(P−1)$. These powers given every non-zero number modulo P. The powers would not ordinarily occur in the ordered sequence $1, 2, \ldots ,P−1$, but would occur in some permutation of the sequence.

For example, if P=17 and R=3, then the first powers of the primitive roots $R^1$, $R^2$, ..., become 3, 9, 27, ..., which MODP=17 equals 3, 9, 10. In general, as may be seen from Table 1, all terms, $1, 2, \ldots, P−1$, would appear in the permutation, each term appearing exactly once.

TABLE 1

| $R^n$ | $m = R^n \bmod P$ |
|---|---|
| $3^1$ | 3 |
| $3^2$ | 9 |
| $3^3$ | 10 |
| $3^4$ | 13 |
| $3^5$ | 5 |
| $3^6$ | 15 |
| $3^7$ | 11 |
| $3^8$ | 16 |
| $3^9$ | 14 |
| $3^{10}$ | 8 |
| $3^{11}$ | 7 |
| $3^{12}$ | 4 |
| $3^{13}$ | 12 |
| $3^{14}$ | 2 |
| $3^{15}$ | 6 |
| $3^{16}$ | 1 |

TABLE 2

| m | n |
|---|---|
| 1 | 16 |
| 2 | 14 |
| 3 | 1 |
| 4 | 12 |
| 5 | 5 |
| 6 | 15 |
| 7 | 11 |
| 8 | 10 |
| 9 | 2 |
| 10 | 3 |
| 11 | 7 |
| 12 | 13 |
| 13 | 4 |
| 14 | 9 |
| 15 | 6 |
| 16 | 8 |

This means that every one of the non-zero integer numbers can be represented as some power. So, for every $n$, $n$ can be made equal to $n$ mod P. It is to be noted that, $R^{P-1}$, the last term in the sequence, equals 1. The range in the exponents may be either from 0 to P−2, or from 1 to P−1, and the resulting sequences are equivalent but for a single cyclic shift.

The prime sequence filter, which includes electrodes 34, has tap weights which are specified by terms in the exponential function (2). This function has an imaginary exponent, and therefore is comprised of cosine and sine terms, which determine the relative sizes of electrodes 34C and 34S, respectively.

Each term in Eq. (2) represents a discrete phase shift relative to zero phase, and all terms have unit magnitude. This set of phase values is in one-to-one correspondence with the prime residue sequence of numbers ($m$) determined by the theory first developed by Gauss. From this, a series of tap weights for the prime sequence filter can be determined. Since the function for the tap weights is an exponential having a magnitude of one, this means that only the phase of the exponential terms varies.

Referring back to Eqs. (2) and (3), for the first tap, $m = 1$, for the next tap, $m = 2$, etc. However, the phase does not change progressively for successive taps, but varies as the power of the exponent in Eq. (3), that is, it varies as $R^1$, $R^2$, $R^3$, etc., that is, as the power of the primitive root.

If one takes the sequence of phases, again using a numerical example of 17 as the prime P, and using three as the primitive root R, $3^1 = 3$ mod 17, $3^2 = 9$ mod 17, $3^3 = 27$ mod 17 = 10, $3^4 = 81$ mod 17 = 13, etc.

The phase is determined by the value of the exponent in the exponential $e(j2\pi m/P)$. Comparing $e(j2\pi m/P)$ and $e(j2\pi R^n/P)$, it can be seen that both terms involve the same phase angle, but not in the same sequence of values of $m$ and $n$. Both phase angles are samples of a complex sinusoid. For example, the phase angle $(2\pi R^n/P)$ is equal to $(2\pi \times 3/17) = (6\pi/17)$ radians when $R = 3$, $n = 1$ and $P = 17$. For the complete range of values of $n$, from 1 to 16, the phase angles will take on a range of values over one complete cycle. The sixteen samples represent a complete complex sinusoid.

Referring back to FIG. 1, the individual interdigitations 34C and 34S of the complex filter are configured to precisely these values, in a permuted order.

The left set of interdigitations, 34C and 34S, the left set of taps, generates, when pulsed, a permuted signal which corresponds to the values of the permuted sequence derived hereinabove. The magnitudes of the lengths of the first tap corresponds to $n=1$ and $m=3$, in Eqs. (2) and (3). These are the phase weights derived from the exponential term in the permuter sequence. The top parts 34C of the interdigitations correspond to the real parts or cosine terms, of the permuter sequence, the bottom parts 34S to the imaginary parts, or sine terms. This relationship could be reversed. It should be noted that for any interdigitation, the sum of the real part squared plus the sum of the imaginary part squared is equal to one. The amplitude of the net weight is equal to one, and the normalized tap lengths for any pair of interdigitated electrodes also equals one.

That part of the surface-wave acoustic (SAW) device 30 to the right reads out the weights as they go by. Typically, the number of interdigitations 36 here would be approximately the same as the number of weighted taps.

Discussing now the delay in the system, the delay occurs between the time pulser 22 is activated and the instant at which the permuter switch 42 is initialized. The permuter switch 42 goes through a fixed sequence, a specific permuted sequence. This sequence is fixed when the synthesizer 10 is made and cannot be readily changed.

However, even if the permuter switch sequence could be changed, the weightings of the input electrodes 34 would also have to be changed. This is because there is a one-to-one correspondence between the sequence that the switch 42 goes through and the arrangement of the input tap weights.

The reason for this is the following. For a given prime number, assume 17 again, there is a specific sequence that can be formed depending on the specific primitive root chosen. There are generally more than one primitive root for each prime number, and, usually, the larger the prime number, the greater the number of primitive roots. The increase is not exactly monotonic, but approximately so.

For each different primitive root, there is a different permutation of the sequence of the length, $P-1$, where P is the prime, and for each permutation there is a particular sequence of taps.

The rotary switch must pick the taps in an inverse order, inverse to the order of the tap weightings shown in TABLE 1, resulting in the values shown in TABLE 2. The values shown in TABLE 2 are inverse to the values shown in TABLE 1 in a modulo number system. Effectively, the switch acts as a "depermutation" device.

If a different primitive root be chosen, there will be a different ordering of the tap weights. The permutation switch 42 would have to go through a different sequence of rotation, corresponding to the inverse of the ordering of the taps.

Discussing now in more detail the various frequencies obtainable, to obtain different frequencies one has to "initialize" or set the switch 42 to different starting points.

As an example, assume a specific primitive root R of a prime number P is chosen. This determines a particular ordering of tap weights, of the input electrodes 34, as well as a particular sequence of tap switching of the permuter switch 42. For simplicity, the sequence may be viewed as an ordering on a circle, so that the initial tap position determines the output frequency which will be obtained. The "delay" actually relates to the starting point of the sequencing of the switch 42.

With respect to the range of frequencies which the synthesizer can synthesize, if the prime number be 17, there are 16 different taps involved, and therefore 16 different frequencies can be synthesized, with the highest baseband frequency being equal to 16 times the lowest baseband frequency.

For SAW carrier operation, if the lowest frequency that could be generated were a carrier frequency, $(f_o+f')$ then all the frequencies which could be synthesized would have values of $(f_o+mf')$, where $f'$ is the constant frequency increment which would exist were the frequencies generated in sequential order. Equivalently, if one were to shift all possible frequencies to baseband by subtracting the value $f_o$, than all would be multiples of the fundamental frequency $f'$, up to the fifteenth harmonic. The total number of different frequencies generated would be one less than the prime number P. (Note: d.c. is not generated).

The modus operandi of the invention is rather complex, but perhaps can be more easily explained if it be assumed that the electrodes 36 are mounted radially around a circle. Assuming first that the electrodes 36 were in an unpermuted sequence, with the lengths of the electrodes the same as described hereinabove, the switch 42 would pick up the pulse from each electrode in succession, the first sample, second, etc., resulting in the "fundamental" frequency being synthesized. For a frequency twice that of the fundamental, (the first harmonic) the signal from every second electrode would be picked off, the first, the third, etc. Where applicable, if the signal is missed at any electrode in the first revolution, it is picked up at subsequent revolutions. The same would apply for the second and other harmonics.

The fact that the electrodes are disposed in a permuted fashion injects an additional variable into the system. Still using the analogy of having the electrodes around a circle, instead of picking off the signal off of every $n$th electrode, the signal is now picked off in a permuted order. Throwing in the delay is involved also, in that it "undoes" the sequence of the permutation due to the ordering of the electrodes 34 on the substrate 32 and effects a sparse sampling of sinusoid terms whose sparseness depends upon the delay.

The number of different primitive roots for each prime number has been derived in the reference to Gauss, cited hereinabove. The number of integers not greater than the given integer and relatively prime to it can also be obtained from Euler's $\phi$-function of an integer, listed in a mathematics dictionary.

The diodes 44 act as switches. Depending on which diode 44 is chosen by the permuted tap selector 42 to be conductive, the signal passing a specific interdigitation can be detected in the output. The tap selector 42 chooses which diodes are to be selected to be conductive.

In summary, the feasibility of using surface acoustic wave devices in a new way as principal elements in ROM frequency synthesis has been demonstrated. In particular, the prime-sequence SAW device is well suited because of its ability to function at the carrier of interest, its inherent phase predictability, its fast-hop capability, and its cyclic nature in the generation of long-duration single frequency waveforms. Such SAW devices also have characteristic properties of relatively light weight, low power, and small size, and can be used as direct synthesizers in the VHF and UHF frequency regions, and for those applications where the hopping rate required may exceed the capabilities of conventional digital techniques. The prime-sequence synthesizer avoids the multiplication inherent in the chirp frequency synthesizer, but does require a permutation device in its output stage.

Obviously, many modifications and variations of the present invention are possible in the light of the above teachings, and, it is therefore understood that within the scope of the disclosed inventive concept, the invention may be practiced otherwise than specifically described.

What is claimed is:

1. A frequency synthesizer, for use with a means for generating two sequences of electrical pulses, one sequence having a delay with respect to the other, comprising:

a surface acoustic wave device, adapted to receive one of the sequences of electrical pulses from the generating means, comprising:
   a substrate;
   a first set of interdigitated electrodes, disposed on the surface of the substrate, the electrodes receiving the electrical pulses and transducing them to acoustic waves, which traverse the surface of the substrate, the lengths of the electrodes being configured as a function of $m$, where $m$ is defined by the relation $m = R^n \mod P$, where P is a prime number, R is a primitive root of P, and $n = 1, 2, \ldots, (P-1)$; and
   a second set of interdigitated electrodes, approximately $P-1$ in number, disposed on the surface of the substrate, the electrodes of the first and second sets being parallel, the second set of electrodes being so disposed as to receive the acoustic waves generated by the first set of electrodes, and transduce them back to electrical signals, which are conducted on a set of leads connected to the electrodes;
   the input and output electrodes being so disposed with respect to each other that the signal received from the top parts of the output electrodes has a phase shift 90°, at a frequency $f_0$, with respect to the phase shift of the signal received from the bottom parts of the output electrodes;
   means adapted to receive pulses from the electrical pulse generating means, which selectively receives the electrical signals from the second set of electrodes, the receiving means having as an output a signal whose frequency is determined by the particular cyclic shift of the order in which the signals are received from the second set of electrodes.

2. The frequency synthesizer according to claim 1, wherein
   the first set of electrodes, which are input electrodes, comprise two sets of electrodes, an upper and lower set, each set consisting of pairs of electrodes, a pair of one set being parallel to a corresponding pair of the other set, the sum of the lengths squared of each two corresponding pairs of electrodes being a constant.

3. The frequency synthesizer according to claim 2, wherein:
   the upper set of input electrodes is so configured as to be offset by one-quarter wavelength from the lower set of input electrodes.

4. The frequency synthesizer according to claim 2, wherein:
   the output electrodes are configured so that the upper half of each output electrode is offset by one-quarter wavelength from its corresponding lower half.

5. The frequency synthesizer according to claim 2, wherein
   the upper set of input electrodes is configured so as to be offset from the bottom set of input electrodes; and wherein:
   the output electrodes are configured so that the upper half of each output electrode is offset from its corresponding bottom half;
   the total amount of offset for the input and output electrodes being one-quarter wavelength.

6. The frequency synthesizer according to claim 2, further comprising:
   the means for generating the two sequences of electrical pulses.

7. The frequency synthesizer according to claim 6 wherein:
   the means for generating two sequences of electrical pulses comprises:
   a first means, whose output is connected to the input electrodes, for producing a sequence of pulses at its output; and
   a second means, whose input is connected to the output of the pulse producing means, for delaying the pulses at its input, the output of the delaying means being connected to the input of the selective receiving means.

8. The frequency synthesizer according to claim 7, further comprising:
   means, the input of which is connected to the output of the first pulse-generating means, for transmitting the pulse to either of two alternate connections; and wherein
   the first pulse-generating means generates pulses alternately to the upper and lower sets of input electrodes with a time delay, $\Delta t = 1/4f_0$, equivalent to an acoustic delay corresponding to a distance equal to one-quarter wavelength.

9. The frequency synthesizer according to claim 8, wherein the receiving means comprises:
   means, adapted to receive the signals from the second set of electrodes which has the same number of inputs as there are pairs of electrodes in the second set of electrodes, the inputs being connected to the electrode outputs;
   means controlling the cyclic shift of the sequence in which the output leads conduct signals; and
   means, adapted to receive input pulses from the pulse-delaying means, and having connections to the output switch, which controls the particular cyclic shift of the sequence by which current is conducted to the output of the selective receiving means.

10. The frequency synthesizer according to claim 9, wherein:

the means adapted to receive input pulses further comprises a set of unilateral conducting devices, one in the output path of each of the pairs of output electrodes, which can be enabled to pass signals through the respective output paths.

* * * * *